United States Patent [19]

Ohuchi

[11] Patent Number: 4,626,783

[45] Date of Patent: Dec. 2, 1986

[54] NUCLEAR MAGNETIC RESONANCE SPECTROSCOPY FOR SELECTIVE DETECTION OF MULTIPLE QUANTUM TRANSITIONS

[75] Inventor: Muneki Ohuchi, Tokyo, Japan

[73] Assignee: JEOL Ltd., Tokyo, Japan

[21] Appl. No.: 717,378

[22] Filed: Mar. 29, 1985

[30] Foreign Application Priority Data

Apr. 5, 1984 [JP] Japan .................................. 59-68216

[51] Int. Cl.$^4$ ............................................. G01R 33/20
[52] U.S. Cl. ..................................... 324/307; 324/310
[58] Field of Search ............... 324/300, 309, 310, 311, 324/308, 314

[56] References Cited

U.S. PATENT DOCUMENTS

| | | | |
|---|---|---|---|
| 4,134,058 | 1/1979 | Ernst | 324/307 |
| 4,238,735 | 12/1980 | Muller | 324/314 |
| 4,510,449 | 4/1985 | Ernst | 324/311 |

OTHER PUBLICATIONS

"Selective Detection of Multiple Quantum Transitions in NMR by Two-Dimensional Spectroscopy" by A. Wokaun et al., *Chemical Physics Letters*, Dec. 15, 1977, vol. 52, No. 3, pp. 407-412.
"Echoes and Antiechoes in Coherence Transfer NMR: Determining the Signs of Double-Quantum Frequencies" by Mareci et al., *Journal of Magnetic Resonance*, vol. 48, pp. 158-163 (1982).

*Primary Examiner*—Michael J. Tokar
*Attorney, Agent, or Firm*—Webb, Burden, Robinson & Webb

[57] ABSTRACT

The present invention relates to an improved nuclear magnetic resonance spectroscopy for selectively detecting multiple quantum transitions of a selected order, the transitions taking place in a sample containing a system of rotating magnetic resonators. The spectrometry comprises the steps of: (a) applying a pulse train to the resonators, the pulse train consisting of RF pulses in which at least one pulse is $\phi$ degrees out of phase with the last pulse; (b) detecting the free induction decay signal emanating from the resonators for a period of time t2 after the application of the pulse train, using two channels of detecting system which are 90° out of phase with each other, and storing it in a memory. The steps are repeated changing the values of the evolution time t1, resetting the values of $\phi$, and adding 90°, 180°, and 270° to all values of $\phi$. The data are combined and converted to frequency domain by double Fourier transformation with respect to t1 and t2.

4 Claims, 12 Drawing Figures

NUCLEAR MAGNETIC RESONANCE SPECTROSCOPY FOR SELECTIVE DETECTION OF MULTIPLE QUANTUM TRANSITIONS

BACKGROUND OF THE INVENTION

The present invention relates to nuclear magnetic resonance spectroscopy and, more particularly, to a nuclear magnetic resonance spectrometer for detection of multiple quantum transitions.

In recent years, two-dimensional NMR has attracted interest as a new method of NMR. According to this new method, nuclear magnetic resonance signals are plotted as a two-dimensional spectrum, thus producing a higher resolution than conventional methods. That is, spectral lines are better split into multiplet patterns. This facilitates analyzing spectra. Hence, it is expected that the method will find much wider application.

In more recent years, a method of obtaining information about multiple quantum transitions, which was impossible for the prior art method to derive, by utilizing the above-mentioned two-dimensional NMR has been proposed as in the *Journal of Magnetic Resonance*, Vol. 48, pp. 158-163, 1982 and *Chem. Phys. Lett.* Vol. 52, No. 3, pp. 407-412, 1977. Referring to FIG. 1, this proposed method uses a pulse train consisting of three 90° pulses: pulse P1 (non-selective pulse), pulse P2 (non-selective pulse), and pulse P3 (mixed pulse). The time period, $\tau$ is fixed. There is a phase difference $\phi$ between radio-frequency signals contained in the pulses P1 and P3. The resulting free induction decay signal FID is detected for a period of time t2 and stored in a memory. The application of the pulses P1 and P2 to a sample creates a disequilibrated statistical state of the rotating magnetic resonators contained in the sample. Thereafter, the mixed pulse P3 is applied which is shifted in phase by the phase angle $\phi$ with respect to the vibration characterizing the previous unequilibrium state of the resonators. The measurement is repeated while varying the period t1 in stepwise fashion. Further, each of these measurements is repeated with different values of the phase angle $\phi$. The resulting free induction decay signals are stored in a memory, corresponding to the values of t1 and the values of $\phi$. Then, linear combinations of the free induction decay signals are formed, and they are converted into the frequency domain by double Fourier transformation, thus producing a two-dimensional spectrum.

In the previously proposed multiple quantum NMR, free induction decay signals are detected with only one channel. In this case, only one frequency range that is higher or lower than the frequency of the irradiating RF pulses is measured, necessarily resulting in a reduction in the signal-to-noise ratio. Further, a memory having a large storage capacity is needed. Another problem arises from the fact that a peak of a spectrum which lies at a position corresponding to the irradiating frequency sees a 90° pulse as it is, but peaks located away from the irradiating frequency do not see it as a 90° pulse. The inevitable result is that the phase alters as the spectral position moves away from the irradiating frequency.

In an attempt to solve these problems, quadrature detection which has been adopted in the conventional nuclear magnetic resonance spectrometry differing from a two-dimensional nuclear magnetic resonance spectrometry may be contemplated. According to this, free induction decay signals are detected with two channels which are 90° out of phase with each other, and the irradiating frequency is set to the center of a range to be measured. Accordingly, the two frequency ranges which are respectively higher and lower than the irradiating frequency can be separately measured. Therefore, if the storage capacity of the memory used is fixed, the resolution can be increased. If the resolution is retained constant, the storage capacity can be reduced. In addition, if the measured range is the same as in the case of using a single channel, the deviation from the irradiating frequency at each end of the measured range is half as compared with the single channel method. The phase shift accompanying the deviation from the irradiating frequency is decreased accordingly.

However, in the multiple NMR utilizing the aforementioned quadrature detection, the phase shift resulting from the deviation from the irradiating frequency decreases but does not become null. Further, if the phase difference between the two channels of detection system is not exactly 90°, if the gains of the two channels are not exactly identical, or if other imbalance between two devices exists, spectral peaks due to folding-back phenomenon or ghost signals may appear in positions of the obtained two-dimensional spectrum where no signals should exist, thus introducing obstacles to the analysis.

SUMMARY OF THE INVENTION

In view of the foregoing, it is the main object of the present invention to provide a multiple quantum nuclear magnetic resonance spectrometry which utilizes quadrature detection but is free of the foregoing difficulties.

The invention pertains to a nuclear magnetic resonance spectrometry for detecting multiple quantum transitions of a selected order, the transitions occurring in a sample containing rotating magnetic resonators. The spectrometry comprises the steps of: (a) applying a pulse train to the resonators, the pulse train consisting of RF pulses in which at least one pulse is $\phi$ degrees out of phase with the last pulse; (b) detecting the free induction decay signal emanating from the resonators for a period of time t2 after the application of the pulse train, using two channels of detecting system which are 90° out of phase with each other, and storing it in a memory; (c) repeating these steps (a) and (b) while changing the value of evolution time t1 in one increment, the evolution time being the pulse spacing between certain pulses in the pulse train; (d) repeating the steps (a)-(c) while successively resetting the value of $\phi$ to a set of predetermined values; (e) forming a set of linear combinations of the free induction decay signals stored corresponding to the values of the evolution time t1 and the values of $\phi$; (f) forming three additional sets of linear combinations of the free induction decay signals by repeating the steps (a)-(e) after adding 90°, 180°, and 270°, respectively, to all the values of $\phi$; (g) forming sets of linear combinations of the free induction decay signals from the four sets of linear combinations of the free induction decay signals by addition or substraction; and (h) converting the sets of linear combinations of the free induction decay signals obtained in step (g) into the frequency domain by double Fourier transformation with respect to t1 and t2.

Other objects and features of the invention will appear in the course of the description that follows.

PREFERRED EMBODIMENTS OF THE INVENTION

Figure 2:
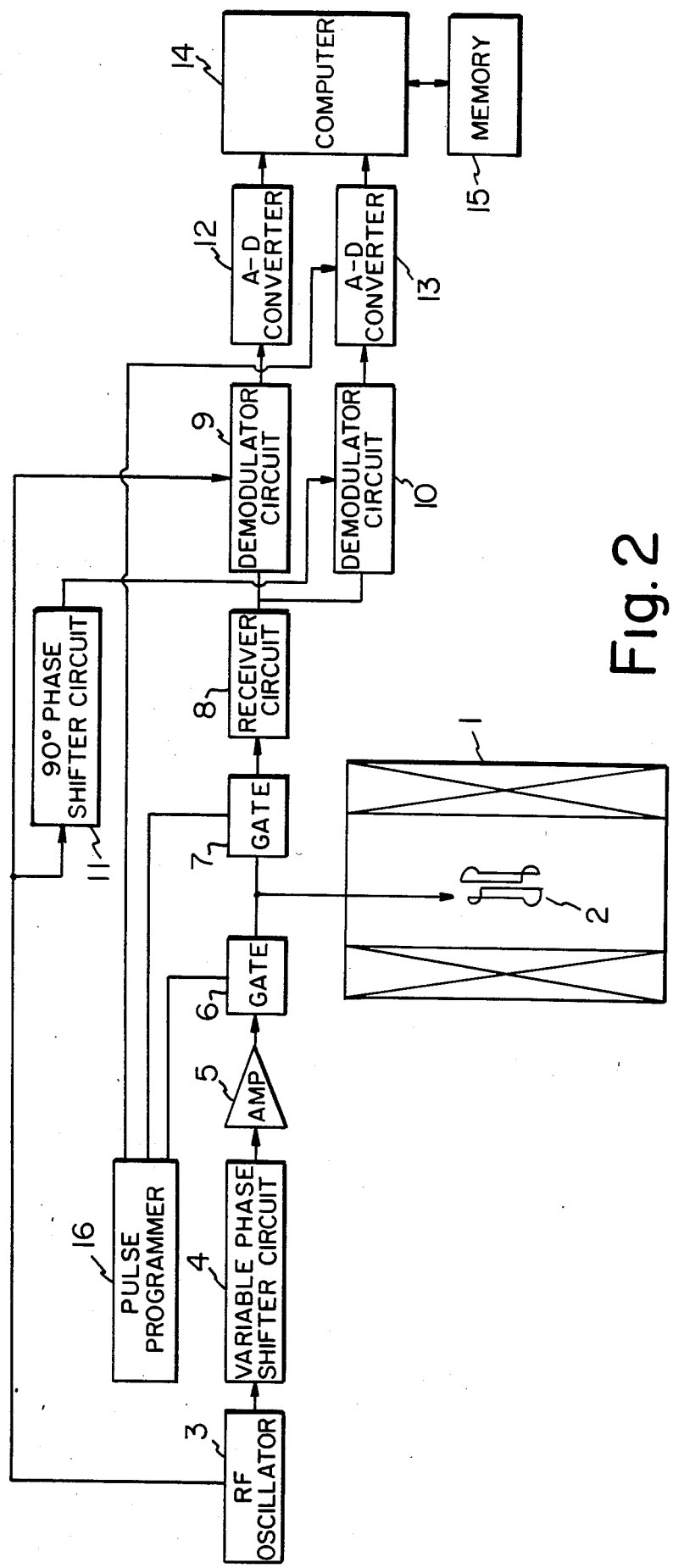
FIG. 2 is a block diagram of a nuclear magnetic resonance spectrometer for carrying out the present invention.

Referring to FIG. 2, there is shown a nuclear magnetic resonance spectrometer for carrying out the present invention. This spectrometer includes a magnet 1 for producing a static magnetic field in which a transmitter coil 2 is disposed. A sample to be investigated is inserted in the space within the coil 2. An RF oscillator 3 produces an RF frequency equal to the resonance frequency of the nuclei to be observed. A variable phase shifter circuit 4 imparts a given phase, which can be changed from 0° to 360° at will, to the RF signal, and then it is supplied as RF pulses to the coil 2 via an amplifier 5 and a gate 6 to irradiate the sample. As a result, a resonance signal is induced in the coil 2, and it is fed via a gate 7 and a receiver circuit 8 to demodulator circuits 9 and 10, each of which also receives the RF signal as a reference signal from the RF oscillator. The RF signal that one of the two demodulator circuits receives has been passed through a 90° phase shifter circuit 11. Thus, the two demodulator circuits 9 and 10 constitute two channels of detection system which are 90° out of phase with each other. The free induction decay signals obtained by these two channels are converted into digital form by analog-to-digital converters 12 and 13 and fed to a computer 14, where they are stored in its memory 15. A pulse programmer 16 has the function of controlling the operation of the phase shifter circuit 4, the gates 6, 7, and the A/D converters 12, 13. The programmer 16 has been already programmed with the sequence of the pulse train irradiating the sample, the pulse duration, the phases of the RF waves contained in the pulses, and the timing for the sampling operations performed by the A/D converters 12 and 13. A series of measurements is carried out according to the program.

Figure 3:
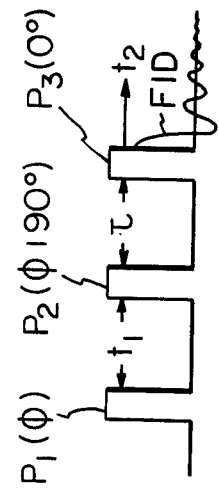
FIG. 3 is a representation of a pulse train used for a triple quantum filter experiment.
Figure 1:
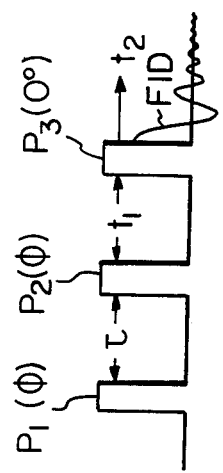
FIG. 1 is a representation of a pulse train used for a previously proposed method.

The present invention is now described in detail by giving an example of triple quantum filter experiment that is conducted by using the spectrometer constructed as described above. This experiment is one of multiple quantum NMR. FIG. 3 shows a pulse train used in the triple quantum filter experiment which was reported by Piantini et al. in *Journal of American Chemical Society*, Vol. 104, pp. 6800–6801. This pulse train consists of three 90° pulses P1, P2, and P3 similar to the pulse train shown in FIG. 1, but t1 and τ are exchanged with each other. The period τ is fixed, and it is assumed that the phase of the RF wave contained in the pulse P3 is 0°. The phases of the RF waves contained in the pulses P1 and P2 are $\phi$ and $\phi+90°$, respectively. The resulting free induction decay signal FID is detected for the period t2 and stored in the memory.

The combinations of phases given to the pulses P1, P2, and P3 in measurements using the pulse train shown in FIG. 3 are indicated in Table A.

TABLE A

|  | P1 | P2 | P3 |  |
|---|---|---|---|---|
| measurement 1 | 0° | 90° | 0° | + |
| measurement 2 | 60° | 150° | 0° | − |
| measurement 3 | 120° | 210° | 0° | + |
| measurement 4 | 180° | 270° | 0° | − |
| measurement 5 | 240° | 330° | 0° | + |
| measurement 6 | 300° | 30° | 0° | − |

In Table A, measurement 1 is conducted under the condition of $\phi=0°$. The phases of the pulses P1, P2, and P3 are set to 0°, and 0°, respectively. The measurement is repeated while changing the period t1 in increments of, for example, 0 to 2 msec. so that the period assumes 512 different values. Thus, 512 free induction decay signals FIDa0–FIDa511 are obtained and stored in a memory.

The next measurement 2 is conducted under the condition of $\phi=60°$. The phases of the pulses P1, P2, and P3 are set to 60°, 150°, and 0°, respectively. In exactly the same manner as in measurement 1, the period t1 is successively varied in increments of 0 to 2 msec. so that it may take 512 different values. Thus, 512 free induction decay signals FIDa0–FIDa511 are derived. Then, these signals are reversed in sign and added to, or subtracted from, the previously stored signals FIDa0–FIDa511 which were obtained in measurement 1, to thereby form linear combinations of the signals.

Figure 4:
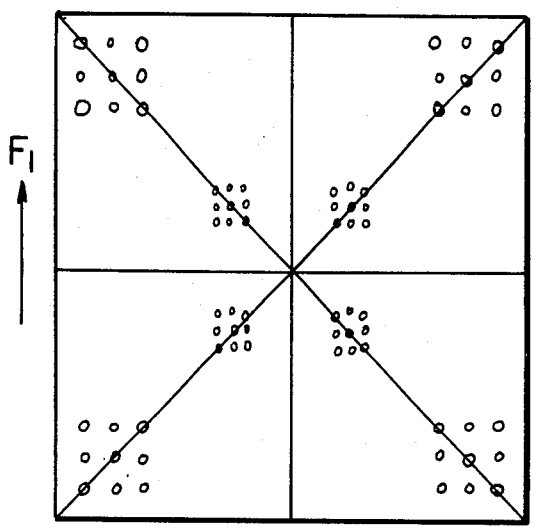
FIG. 4 is a schematic representation of a two-dimensional spectrum obtained in accordance with a previously proposed procedure, the representation being drawn using contour lines.

In exactly the same manner, measurements 3–6 are made, and the free induction decay signals FIDa0–FIDa511 obtained in each measurement are added or subtracted, depending upon the sign + or − indicated in Table A. As a result, a set $S_a$ of linear combinations of the free induction decay signals is obtained. Then, a two-dimensional spectrum as shown in FIG. 4 is obtained by taking the double Fourier transform of the set $S_a$ of the free induction decay signals with respect to t1 and t2. FIG. 4 is a schematic representation, using contour lines, of all the four Fourier components derived by the double Fourier transformation.

The measurements carried out according to the procedure described above have been described by Piantini et al. in the aforementioned paper. They used an instrument which had only one channel of detection system and contained neither the demodulator circuit 10 nor the 90° phase shifter circuit 11 shown in FIG. 2. Hence, various disadvantages already mentioned have been introduced.

Figure 5:
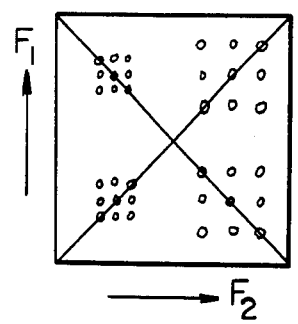
FIG. 5 shows a two-dimensional spectrum obtained by utilizing quadrature detection.

In contrast, the present invention employs a quadrature detection system equipped with two channels of detection system which are 90° out of phase with each other. By making measurements using the system of FIG. 2 in accordance with Table A, the above-described set $S_a$ of FIDa-0–FIDa511 is derived. In addition, another set $S_a'$ of free induction decay signals FIDa0'-FIDa511' which are 90° out of phase with the above signals is obtained from the other channel. Then, we take the double Fourier transform of the set $S_a$ of FIDa0-FIDa511 and the set $S_a'$ of FIDa0'-FIDa511'. Note that the Fourier transformation with respect to t2 is a complex Fourier transformation. In this way, a two-dimensional spectrum as shown in FIG. 5 is provided under the condition that the frequency of the RF pulses lies at the center of the measured range. All of the data derived from the measured range can be stored in a quarter of the memory, thus saving the storage capacity. If the same storage capacity is used, the resolution will be enhanced.

Where measurements are made in accordance with Table A by simply adding one more channel of detection system as described above, the detected signal is a free induction decay signal existing for the period t2. The higher and lower frequency sides to the irradiating frequency can be distinguished from each other on the axis of $F_2$ which has been obtained by taking the complex Fourier transform with respect to t2. Therefore, no folding-back is produced along the axis $F_2$. However, as shown in FIG. 5, folding-back takes place along the axis $F_1$ which was not derived by complex Fourier transformation. In an actual spectrum that is a jumble of complicated peaks, such a folding-back along the axis $F_1$ hinders the analysis.

To remove this folding-back, a measurement is made according to the following Table B as well as the measurement conforming to Table A. Thus, a pseudo-quadrature detection is employed in the direction of the axis $F_1$.

TABLE B

|  | P1 | P2 | P3 |  |
|---|---|---|---|---|
| measurement 7 | 0° | 180° | 90° | + |
| measurement 8 | 60° | 240° | 90° | − |
| measurement 9 | 120° | 300° | 90° | + |
| measurement 10 | 180° | 0° | 90° | − |
| measurement 11 | 240° | 60° | 90° | + |
| measurement 12 | 300° | 120° | 90° | − |

Figure 6A:
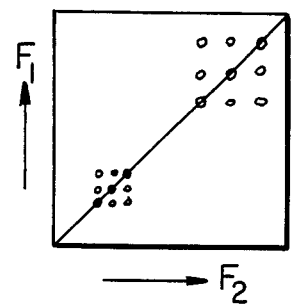
FIG. 6(a) shows a two-dimensional spectrum in which ghosts have been removed by the method according to the present invention.

The phases of the pulses P2 and P3 in Table B are shifted by 90° from those of the pulses P2 and P3 in Table A. The set $S_a$ of FIDa0-FIDa511 and the set $S_a'$ of FIDa0'-FIDa511' are obtained from the single channel of detection system which relates to t1, for example. The set $S_b$ of FIDb0-FIDb511 and the set $S_b'$ of FIDb0'-FIDb511' that are produced by the measurements 7-12 should correspond to the free induction decay signals obtained by another channel of detection system which is 90° out of phase with the above channel and relates to t1, it being noted that, in reality, these free induction decay signals do not exist. The set $S_a$ of FIDa0-FIDa511, the set $S_a'$ of FIDa0'-FIDa511' derived by the measurements according to Table A, the set of $S_b$ of FIDb0-FIDb511, an the set $S_b'$ of FIDb0'-FIDb511' derived by the measurements according to Table B are linearly combined as by addition or subtraction. The data is subjected to complex Fourier transformation with respect to t1 and t2 to give rise to a two-dimensional spectrum, where, as shown in FIG. 6(a), the folding-back should have been successfully removed along the axes of $F_1$ and $F_2$.

Figure 6B:
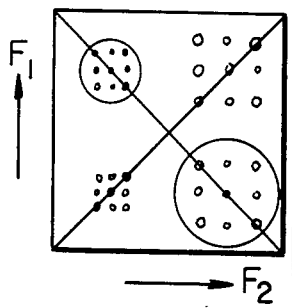
FIG. 6(b) shows a two-dimensional spectrum in which ghosts appear.

In actuality, however, there exists an imbalance between the aforementioned two channels of detection system or the phase shift which is reduced by the quadrature detection but does not vanish completely. Hence, the folding-back phenomenon is not completely removed, and it is inevitable that ghost signals as surrounded by the circles in FIG. 6(b) appear in the obtained two-dimensional spectrum.

Accordingly, the present invention adds measurements according to the following Tables C and D, for removing ghost signals.

TABLE C

|  | P1 | P2 | P3 |  |
|---|---|---|---|---|
| measurement 13 | 0° | 270° | 180° | + |
| measurement 14 | 60° | 330° | 180° | − |
| measurement 15 | 120° | 30° | 180° | + |
| measurement 16 | 180° | 90° | 180° | − |
| measurement 17 | 240° | 150° | 180° | + |
| measurement 18 | 300° | 210° | 180° | − |

TABLE D

|  | P1 | P2 | P3 |  |
|---|---|---|---|---|
| measurement 19 | 0° | 0° | 270° | + |
| measurement 20 | 60° | 60° | 270° | − |
| measurement 21 | 120° | 120° | 270° | + |
| measurement 22 | 180° | 180° | 270° | − |
| measurement 23 | 240° | 240° | 270° | + |
| measurement 24 | 300° | 300° | 270° | − |

The phases of the pulses P2 and P3 in Table C are shifted by 90° from those of the pulses P2 and P3 in Table B. The phases of the pulses P2 and P3 in Table D are shifted by 90° from those of the pulses P2 and P3 in Table C. The measurements are made in exactly the same manner as in the measurements according to Tables A and B except for these phases. The measurements according to Table C result in a set $S_c$ of FIDc0-FIDc511 and a set $S_c'$ of FIDc0'-FIDc511'. The measurements made according to Table D yield a set $S_d$ of FIDd0-FIDd511 and a set $S_d'$ of FIDd0'-FIDd511'.

The comparison between Tables A and C shows that the pulses P2 and P3 in Table C are 180° out of phase with the pulses P2 and P3 in Table A. Accordingly, the sets $S_c$ and $S_c'$ obtained by the measurements according to Table C are added to the sets $S_a$ and $S_a'$, respectively, obtained by the measurements according to Table A to produce $S_a+S_c$ and $S_a'+S_c'$. This cancels out the ghost components because their signs are reversed between Tables A and C.

Similarly, the comparison between Tables B and D shows that the pulses P2 and P3 in Table D are 180° out of phase with the pulses P2 and P3 in Table B. Since the ghost components are reversed in sign between Tables B and D, the ghost components are cancelled out by adding the sets $S_b$ and $S_b'$ obtained by the measurements according to Table B to the sets $S_d$ and $S_d'$, respectively, derived by the measurements according to Table D.

Then, a linear combination of $S_a+S_c$ and $S_a'+S_c'$ and a linear combination of $S_b+S_d$ and $S_b'+S_d'$ are formed as by addition or substraction. Subsequently, the data is subjected to complex Fourier transformation with respect to t1 and t2, producing a two-dimensional spectrum free of ghost components as shown in FIG. 6(a). This permits correct analysis.

Even if measurements and processings are carried out according to the procedure described above, the imbalance between the two channels of detection system may produce ghost signals. In this case, three additional series of measurements are made in which 90°, 180°, and 270°, are respectively added to all the phases in Tables A-D. The data items obtained for each identical phase are linearly combined to remove ghost signals.

Figure 7A:
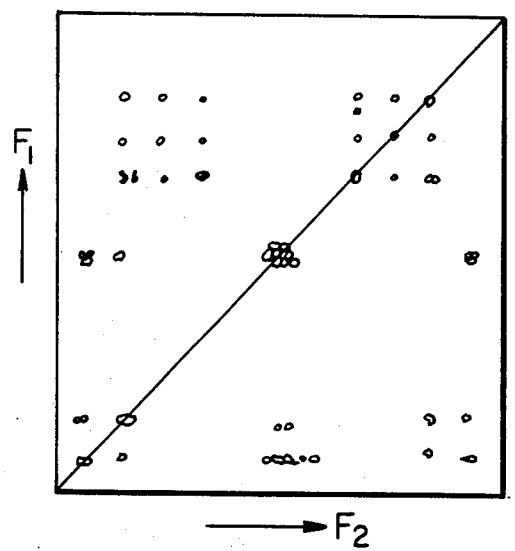
FIGS. 7(a), 7(b), 8(a), and 8(b) are representations for illustrating the advantages obtained by the present invention.
Figure 7B:
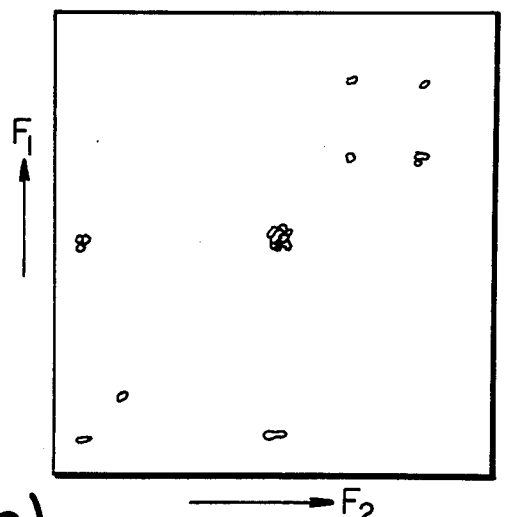
Figure 8A:
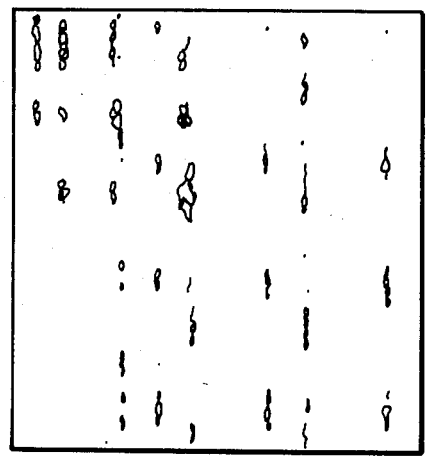
Figure 8B:
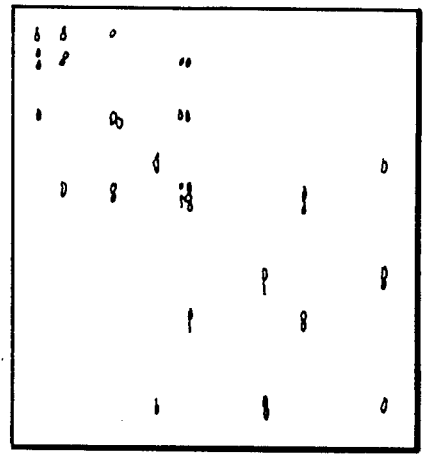

FIGS. 7 and 8 show two-dimensional spectra for illustrating the effects of the invention. The spectra of FIGS. 7(a) and 8(a) correspond to the spectrum of FIG. 5 and in which folding-back and ghost signals appear. The spectra of FIGS. 7(b) and 8(b) correspond to the spectrum of FIG. 6(a) and in which folding-back and ghost signals have been removed by the invention.

The present invention has been described thus far about the triple quatum filter, but it can also be similarly applied to double and quadruple filters. In the above description, for each value of phase $\phi$ the period t1 was changed so as to assume 512 different values. The measurement was repeated with different values of $\phi$. Alternatively, the value of t1 may be kept constant, and the value of $\phi$ may be changed in stepwise fashion. This measurement may be repeated with 512 different values of t1. This alternative embodiment yields the same number of data items as the foregoing embodiment and gives the same result. This alternative method for measurements comprises the steps of: (a) applying a pulse train to the rotating magnetic resonators contained in a sample, the pulse train consisting of RF pulses in which at least one pulse is $\phi$ degrees out of phase with the last pulse; (b) detecting the free induction decay signal emanating from the resonators for a period of time t2 after the application of the pulse train, using two channels of detecting system which are 90° out of phase with each other; (c) repeating these steps (a) and (b) while successively resetting the value of $\phi$ to a set of predetermined values; (d) forming linear combinations of the free induction decay signals detected corresponding to the various values of $\phi$; (e) forming three additional sets of free induction decay signals by repeating the steps (a)–(d) after adding 90°, 180°, and 270′, respectively, to all the values of $\phi$; (f) forming sets of linear combinations of the free induction decay signals from the four sets of linear combinations of the free induction decay signals by addition or subtraction; (g) repeating the steps (a) and (f) after changing evolution time t1 by one increment, the evolution time being the pulse spacing between certain pulses in the pulse train; and (h) converting the sets of the linear combinations of the free induction decay signals obtained in step (g) into the frequency domain by double Fourier transformation with respect to t1 and t2.

Figure 9:
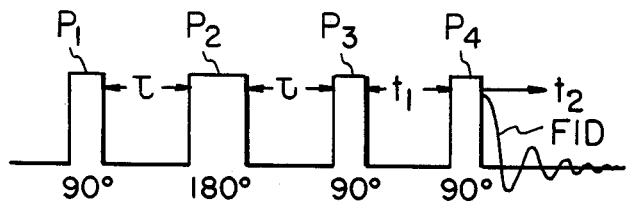
FIG. 9 is a representation of a pulse train used for a triple quantum coherence experiment.

Further, the invention can be applied to multiple quatum coherence. FIG. 9 shows an example of pulse train used for a triple quantum coherence experiment that is one of multiple quantum coherences. This pulse train consists of four pulses; 90′, 180°, 90°, and 90° pulses. The phases of the sequence of pulses are set in the manner indicated in Table E.

TABLE E

|  | P1 | P2 | P3 | P4 |
| --- | --- | --- | --- | --- |
| measurement 1 | 0° | 0° | 90° | 0° |
| measurement 2 | 60° | 60° | 150° | 0° |
| measurement 3 | 120° | 120° | 210° | 0° |
| measurement 4 | 180° | 180° | 270° | 0° |
| measurement 5 | 240° | 240° | 330° | 0° |
| measurement 6 | 300° | 300° | 30° | 0° |

Note that in this case, measurements according to Table F are needed, in addition to the measurements described above. The phases of the pulses P1, P2, and P3 in Table F are obtained by adding +30° to the phases of P1, P2, and P3 in Table E respectively.

TABLE F

|  | P1 | P2 | P3 | P4 |
| --- | --- | --- | --- | --- |
| measurement 7 | 30° | 30° | 120° | 0° |
| measurement 8 | 90° | 90° | 180° | 0° |
| measurement 9 | 150° | 150° | 240° | 0° |
| measurement 10 | 210° | 210° | 300° | 0° |
| measurement 11 | 270° | 270° | 0° | 0° |
| measurement 12 | 330° | 330° | 60° | 0° |

The data obtained by the measurements according to Table E is combined with the data obtained by the measurements according to Table F by addition or subtraction. Similar three series of measurements are made after adding 90°, 180°, and 270°, respectively, to the phases of the pulses P4 in Tables E and F. As already described, the resulting data items are linearly combined and then subjected to double Fourier transformation.

I claim:

1. A nuclear magnetic resonance spectroscopy method for detecting multiple quantum transitions of a selected order, the transitions occurring in a sample containing rotating magnetic resonators, comprising the steps of:
  (a) applying a pulse train to the resonators, the pulse train consisting of RF pulses in which at least one pulse is $\phi$ degrees out of phase with the last pulse;
  (b) detecting the free induction decay signal emanating from the resonators for a period of time t2 after the application of the pulse train, using two channels of detecting system which are 90° out of phase with each other, and storing it in a memory;
  (c) repeating these steps (a) and (b) while changing the value of evolution time t1 in one increment, the evolution time being the pulse spacing between certain pulses in the pulse train;
  (d) repeating the steps (a)–(c) while successively resetting the value of $\phi$ to a set of predetermined values;
  (e) forming a set of linear combinations of the free induction decay signals stored corresponding to the values of the evolution time t1 and the values of $\phi$;
  (f) forming three additional sets of linear combinations of the free induction decay signals by repeating the steps (a)–(e) after adding 90°, 180°, and 270°, respectively, to all the values of $\phi$;
  (g) forming sets of linear combinations of the free induction decay signals from the four sets of linear combinations of the free induction decay signals by addition or subtraction; and
  (h) converting the sets of the linear combinations of the free induction decay signals obtained in step (g) into the frequency domain by double Fourier transformation with respect to t1 and t2.

2. The nuclear magnetic resonance spectroscopy of claim 1, wherein the pulse train consists of three 90° pulses, and wherein the pulse spacing between certain two of these three 90° pulses is set to t1.

3. A nuclear magnetic resonance method for detecting multiple quantum transitions of a selected order, the transitions occurring in a sample containing rotating magnetic resonators, comprising the steps of:
  (a) applying a pulse train to the resonators, the pulse train consisting of RF pulses in which at least one pulse is $\phi$ degrees out of phase with the last pulse;

(b) detecting the free induction decay signal enamating from the resonators for a period of time t2 after the application of the pulse train, using two channels of detecting system which are 90° out of phase with each other;

(c) repeating the steps (a) and (b) while successively resetting the value of 100 to a set of predetermined values;

(d) forming a set of linear combinations of the free induction decay signals detected corresponding to the various values of φ;

(e) forming three additional sets of linear combinations of the free induction decay signals by repeating the steps (a)–(d) after adding 90°, 180°, and 270°, respectively, to all the values of φ;

(f) forming sets of linear combinations of the free induction decay signals from the four sets of linear combinations of the free induction decay signals by addition or subtraction;

(g) repeating the steps (a)–(f) after changing evolution time t1 in one increment, the evolution time being the pulse spacing between certain two in the pulse train; and (h) converting the sets of the linear combinations of the free induction decay signals obtained in step (g) into the frequency domain by double Fourier transformation with respect to t1 and t2.

4. The nuclear magnetic resonance spectrometry of claim 3, wherein the pulse train consists of three 90° pulses, and wherein the pulse spacing between certain two of these three 90° pulses is set to t1.

* * * * *